United States Patent
Kim et al.

(10) Patent No.: US 10,685,690 B2
(45) Date of Patent: Jun. 16, 2020

(54) MEMORY DEVICE IN WHICH LOCATIONS OF REGISTERS STORING FAIL ADDRESSES ARE MERGED

(71) Applicant: SAMSUNG ELECTRONICS CO., LTD., Suwon-si (KR)

(72) Inventors: Hyung-Jin Kim, Uiwang-si (KR); Huikap Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/222,114

(22) Filed: Dec. 17, 2018

(65) Prior Publication Data
US 2019/0378551 A1 Dec. 12, 2019

(30) Foreign Application Priority Data
Jun. 11, 2018 (KR) .......................... 10-2018-0066980

(51) Int. Cl.
| | |
|---|---|
| *G11C 7/00* | (2006.01) |
| *G11C 8/10* | (2006.01) |
| *G11C 17/16* | (2006.01) |
| *G06F 11/20* | (2006.01) |
| *G11C 17/18* | (2006.01) |

(52) U.S. Cl.
CPC ............ *G11C 8/10* (2013.01); *G06F 11/2094* (2013.01); *G11C 17/16* (2013.01); *G11C 17/18* (2013.01); *G06F 2201/82* (2013.01)

(58) Field of Classification Search
CPC .............................................. G11C 2229/763
USPC ......................................................... 365/200
See application file for complete search history.

(56) References Cited

U.S. PATENT DOCUMENTS

| | | | |
|---|---|---|---|
| 6,249,476 | B1 | 6/2001 | Yamazaki et al. |
| 6,707,730 | B2 | 3/2004 | Mori et al. |
| 9,123,395 | B2 | 9/2015 | Kwak et al. |
| 2008/0084771 | A1 | 4/2008 | Kajigaya |
| 2013/0294141 | A1* | 11/2013 | Oh .......................... G11C 17/18 365/96 |
| 2016/0012908 | A1 | 1/2016 | Kang |

FOREIGN PATENT DOCUMENTS

| | | |
|---|---|---|
| KR | 10-2007-0057336 A | 6/2007 |
| KR | 10-0968465 B1 | 7/2010 |
| KR | 10-1161389 B1 | 7/2012 |

* cited by examiner

*Primary Examiner* — Hoai V Ho
(74) *Attorney, Agent, or Firm* — Sughrue Mion, PLLC

(57) ABSTRACT

A memory device includes a bank that includes first memory cells connected to a first column selection line and second memory cells connected to a second column selection line, a first column decoder that selects the first memory cells by transmitting a first column selection signal in a first direction through the first column selection line, and a second column decoder that selects the second memory cells by transmitting a second column selection signal in a second direction opposite to the first direction through the second column selection line. The first column decoder includes a first register that stores a first fail column address of the first memory cells, and a second register that stores a second fail column address of the second memory cells.

9 Claims, 10 Drawing Sheets

MEMORY DEVICE IN WHICH LOCATIONS OF REGISTERS STORING FAIL ADDRESSES ARE MERGED

CROSS-REFERENCE TO RELATED APPLICATIONS

This application claims priority under 35 U.S.C. § 119 from Korean Patent Application No. 10-2018-0066980 filed on Jun. 11, 2018, in the Korean Intellectual Property Office, the disclosure of which is incorporated by reference herein in its entirety.

BACKGROUND

1. Field

Apparatuses and devices consistent with the present disclosure relate to a memory device, and more particularly, to a memory device in which locations of registers storing fail addresses are merged.

2. Description of the Related Art

A memory device is being used widely in electronic devices such as a mobile device, a computer, etc. A capacity of the memory device is increasing as manufacturing process technologies develop. As miniaturization process technologies develop, fail memory cells of the memory device are gradually increasing. To repair the fail memory cells, the memory device may include redundancy memory cells, and registers which store fail addresses indicating locations of the fail memory cells.

As the capacity of the memory device increases, the size of a memory cell array in the memory device may gradually increase. The memory device may include circuits which drive the memory cell array on both sides. In the case where the registers storing fail addresses are disposed in all the circuits described above, the area of the memory device may increase.

SUMMARY

It is an aspect to provide a memory device in which locations of registers storing fail addresses are merged.

According to an aspect of exemplary embodiment, a memory device may include a bank that includes first memory cells connected to a first column selection line and second memory cells connected to a second column selection line, a first column decoder that selects the first memory cells by transmitting a first column selection signal in a first direction through the first column selection line, and a second column decoder that selects the second memory cells by transmitting a second column selection signal in a second direction opposite to the first direction through the second column selection line. The first column decoder may include a first register that stores a first fail column address of the first memory cells, and a second register that stores a second fail column address of the second memory cells.

According to another aspect of an exemplary embodiment, a memory device may include a bank that includes first memory cells connected to a first word line and second memory cells connected to a second word line, a first row decoder that selects the first memory cells by transmitting a first row selection signal in a first direction through the first word line, and a second row decoder that selects the second memory cells by transmitting a second row selection signal in a second direction opposite to the first direction through the second word line. The first row decoder may include a first register that stores a first fail row address of the first memory cells, and a second register that stores a second fail row address of the second memory cells.

According to another aspect of an exemplary embodiment, a memory device may include a first bank including first memory cells connected to a first column selection line, first input/output lines of the first memory cells being arranged in the first bank, a second bank including second memory cells connected to a second column selection line, second input/output lines of the second memory cells being arranged in the second bank, a first column decoder configured to select the first memory cells by transmitting a first column selection signal in a first direction through a first column selection line and to perform first data input/output on the first memory cells through the first input/output lines, and a second column decoder configured to select the second memory cells by transmitting a second column selection signal in a second direction opposite to the first direction through a second column selection line and to perform second data input/output on the second memory cells through the second input/output lines, wherein the first column decoder includes a first register configured to store a first fail column address of the first memory cells in the first bank and a second register configured to store a second fail column address of the second memory cells in the second bank.

DETAILED DESCRIPTION

Below, exemplary embodiments may be described in detail and clearly to such an extent that an ordinary one in the art may easily implement the inventive concept.

Figure 1:
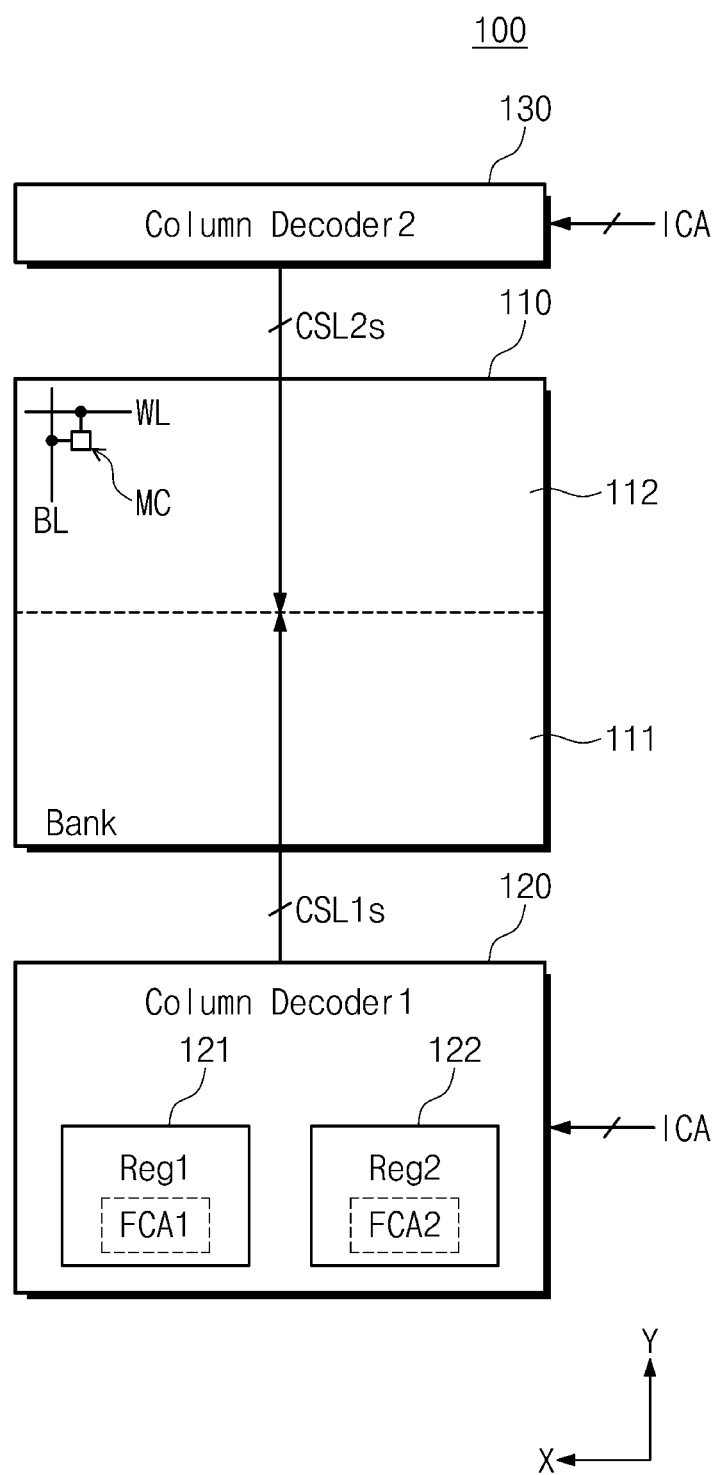
FIG. 1 is a block diagram illustrating a memory device according to an exemplary embodiment.

FIG. 1 is a block diagram illustrating a memory device according to an exemplary embodiment. A memory device 100 may include a bank 110, a first column decoder 120, and a second column decoder 130.

The bank 110 may be a memory cell array including memory cells arranged or disposed along an X-axis and a Y-axis perpendicular to the X-axis. A memory cell MC may be connected to a word line WL and a bit line BL, with the word line WL parallel to the X-axis and the bit line BL parallel to the Y-axis. For example, a memory cell may include at least one of a dynamic random access memory (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, and a magnetic random access memory (MRAM) cell. The below description is provided of a memory cell that is a DRAM cell. However, this is only an example and the inventive concept is not limited to a DRAM cell as discussed above. The bank 110 may include a first region 111 which is accessed by the first column decoder 120 and a second region 112 which is accessed by the second column decoder 130. Memory cells which are selected by the first column decoder 120 may be arranged or disposed in the first region 111. Memory cells which are selected by the second column decoder 130 may be arranged or disposed in the second region 112.

The first column decoder 120 may decode an input column address ICA and may generate first column selection signals based on a result of decoding the ICA. The first column decoder 120 may transmit the first column selection signals in the direction of the Y-axis through first column selection lines CSL1s and may select memory cells corresponding to the input column address ICA. The first column decoder 120 may drive, select, or activate the first column selection lines CSL1s in the Y-axis direction. Each of the first column selection lines CSL1s may be connected with at least one bit line.

The second column decoder 130 may decode the input column address ICA and may generate second column selection signals based on a result of decoding the ICA. The second column decoder 130 may transmit the second column selection signals in an opposite direction (e.g., a negative Y-axis direction) to the Y-axis direction (e.g., a positive Y-axis direction) through second column selection lines CSL2s and may select memory cells corresponding to the input column address ICA. The second column decoder 130 may drive the second column selection lines CSL2s in the opposite direction to the Y-axis direction. The same input column address ICA may be input to the first column decoder 120 and to the second column decoder 130.

In a related art case where a bank is driven only by a single column decoder, for example, where the bank 110 is driven only by the first column decoder 120 without the second column decoder 130, the first column decoder 120 should select memory cells of the second region 112 as well as memory cells of the first region 111, that is, all memory cells of the bank 110. To this end, the first column decoder 120 should drive column selection lines, the lengths of which correspond to a vertical length (i.e., a length on the Y-axis) of the bank 110. However, as the size of the bank 110 increases, loads of the column selection lines may increase. In particular, since voltages of the column selection lines (or voltages of column selection signals) are used to turn on or turn off transistors connected with bit lines, for example, the voltages may transition from a ground voltage to a power supply voltage, and vice versa. That is, as the size of the bank 110 increases, the driving ability of the first column decoder 120 with regard to the column selection lines may become worse. Accordingly, the memory device 100 according to exemplary embodiments may include the first column decoder 120 and the second column decoder 130 which drive one bank 110 in two directions (e.g., in opposite directions). The first column decoder 120 and the second column decoder 130 may be opposite to each other with respect to the bank 110 or may face each other with respect to the bank 110, the bank 110 may be interposed between the first column decoder 120 and the second column decoder 130, and the first column decoder 120 and the second column decoder 130 may be respectively positioned on opposite sides or two sides of the bank 110.

Referring to FIG. 1, the first column decoder 120 may include a first register 121 storing a first fail column address FCA1 for repairing the first column selection lines CSL1s. When the input column address ICA is matched with the first fail column address FCA1, the first column decoder 120 may drive redundancy column selection lines (not illustrated) instead of column selection lines corresponding to the input column address ICA.

The first column decoder 120 may further include a second register 122 storing a second fail column address FCA2 for repairing the second column selection lines CSL2s. When the input column address ICA is matched with the second fail column address FCA2, the second column decoder 130 may drive redundancy column selection lines (not illustrated) instead of column selection lines corresponding to the input column address ICA.

In some exemplary embodiments, the first column decoder 120 may include both the first register 121 for repairing the first column selection lines CSL1s and the second register 122 for repairing the second column selection lines CSL2s but the second column decoder 130 may not include the second register 122. Accordingly, the first column decoder 120 may share or merge write circuits which write the first fail column address FCA1 and the second fail column address FCA2 to the first register 121 and the second register 122, respectively. Also, the first column decoder 120 may share or merge a compare circuit comparing the input column address ICA with the first fail column address FCA1 and a compare circuit comparing the input column address ICA with the second fail column address FCA2. The area of the memory device 100 may decrease by sharing the write circuits and the compare circuits and by simplifying the second column decoder 130.

Figure 2:
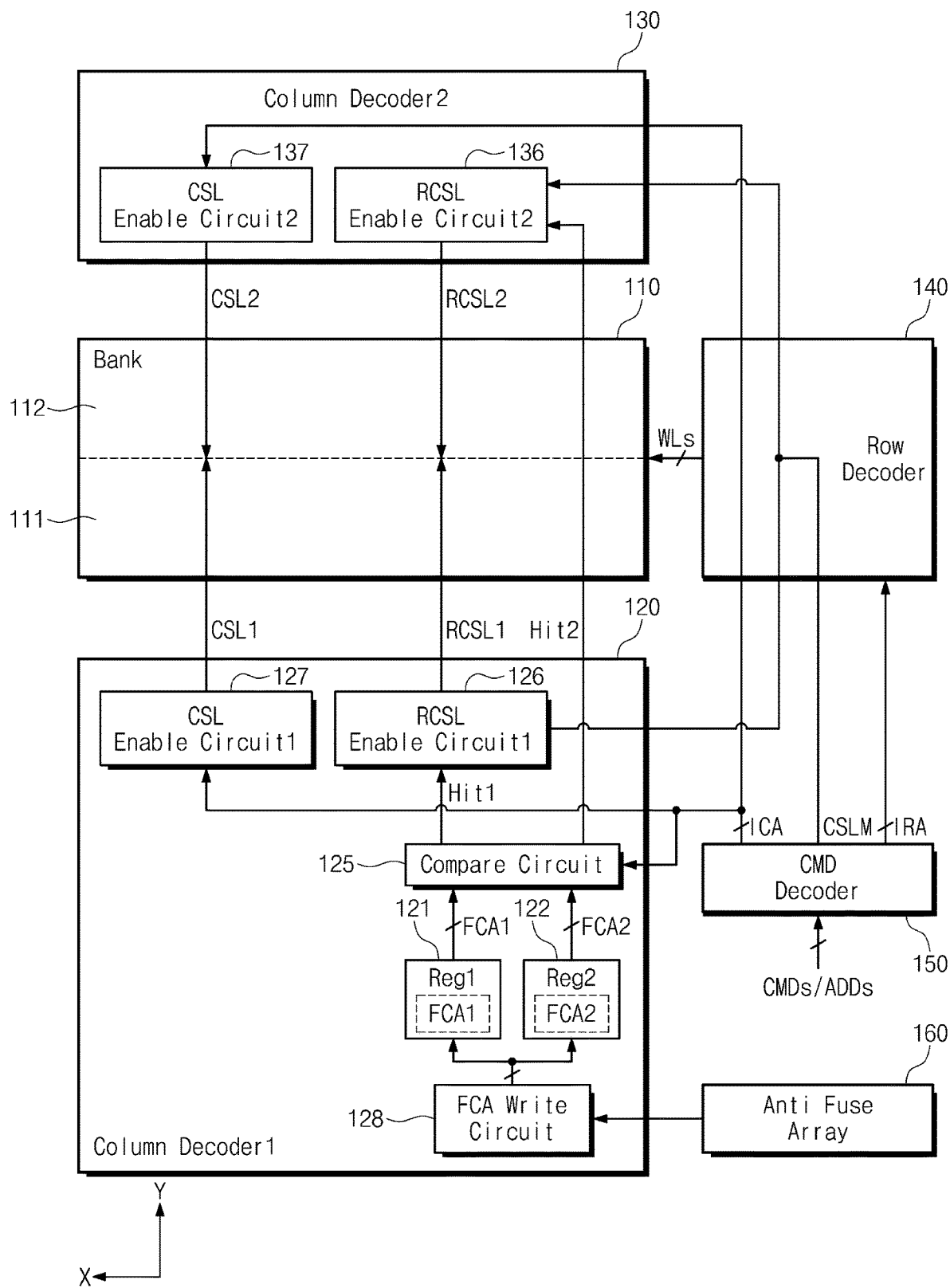
FIG. 2 is a block diagram illustrating a first column decoder and a second column decoder of the memory device of FIG. 1, according to an exemplary embodiment.

FIG. 2 is a block diagram illustrating the first column decoder and the second column decoder of the memory device of FIG. 1, according to an exemplary embodiment. FIG. 2 will be described with reference to FIG. 1. The memory device 100 may include the bank 110, the first column decoder 120, the second column decoder 130, a row decoder 140, a command (CMD) decoder 150, and an anti-fuse array 160. The bank 110 has been described above with reference to FIG. 1, and thus a repeated description is omitted for conciseness.

The first column decoder 120 may include the first register 121, the second register 122, a compare circuit 125, a first redundancy column selection line (RCSL) enable circuit 126, a first column selection line (CSL) enable circuit 127, and a fail column address (FCA) write circuit 128. The first register 121 and the second register 122 have been described above with reference to FIG. 1, and thus a repeated description is omitted for conciseness.

The compare circuit 125 may compare the input column address ICA with one of the first fail column address FCA1 and the second fail column address FCA2. The first column decoder 120 may share or merge a compare circuit comparing the input column address ICA with the first fail column address FCA1 and a compare circuit comparing the input column address ICA with the second fail column address FCA2.

When memory cells of the first region 111 are selected by the row decoder 140, the compare circuit 125 may compare the input column address ICA with the first fail column address FCA1. When the input column address ICA is matched with the first fail column address FCA1, the compare circuit 125 may generate a first hit signal Hit1. When memory cells of the second region 112 are selected by the row decoder 140, the compare circuit 125 may compare the input column address ICA and the second fail column address FCA2. When the input column address ICA is matched with the second fail column address FCA2, the compare circuit 125 may generate a second hit signal Hit2.

The compare circuit 125 may transmit the second hit signal Hit2 to the second column decoder 130. The first column decoder 120 may include one or more first registers 121 and one or more second registers 122 based on the following of the memory device 100: the yield, the area, and repair efficiency. For example, in the case where the first registers 121 and the second registers 122 are distributed and positioned within the first column decoder 120, the compare circuit 125 may transmit the second hit signal Hit2 to the second column decoder 130 across/through the bank 110. For another example, in the case where the first registers 121 and the second registers 122 are intensively positioned within a region adjacent to both the first column decoder 120 and the row decoder 140, the compare circuit 125 may transmit the second hit signal Hit2 to the second column decoder 130 across/through the row decoder 140. The first column decoder 120 may include one or more compare circuits 125 depending on the number of the first registers 121 and the second registers 122. An example is illustrated in FIG. 2 in which only one second hit signal Hit2 is transmitted to the second column decoder 130. However, the one or more compare circuits 125 may transmit one or more second hit signals (i.e., a bus) to the second column decoder 130.

When one of word lines of the first region 111 is activated by the row decoder 140, the first register 121 may provide the first fail column address FCA1 to the compare circuit 125. When one of word lines of the second region 112 is activated by the row decoder 140, the second register 122 may provide the second fail column address FCA2 to the compare circuit 125. Whether each of the first register 121 and the second register 122 provides a relevant address may be determined depending on a location of a word line activated by the row decoder 140. The first fail column address FCA1 and the second fail column address FCA2 may be identical to or different from each other.

In an exemplary embodiment, it is assumed that at least one of memory cells to be selected through a first column selection line CSL1 is a fail memory cell and a column address corresponding to the first column selection line CSL1 is stored in the first register 121 as the first fail column address FCA1. When a read command or a write command for the memory cells to be selected through the first column selection line CSL1 is input to the memory device 100, the compare circuit 125 may activate the first hit signal Hit1. When the first hit signal Hit1 is activated, the first redundancy column selection line (RCSL) enable circuit 126 may transmit a first redundancy column selection signal in the Y-axis direction through a first redundancy column selection line RCSL1. In contrast, the first column selection line (CSL) enable circuit 127 may not transmit a first column selection signal in the Y-axis direction through the first column selection line CSL1.

Unlike the above assumption, when the first hit signal Hit1 is not activated and one of word lines of the first region 111 is activated by the row decoder 140, the first column selection line (CSL) enable circuit 127 may transmit the first column selection signal in the Y-axis direction through the first column selection line CSL1 depending on the input column address ICA. The first column selection line CSL1 of FIG. 2 may be one of the first column selection lines CSL1s of FIG. 1.

To sum up, the first column decoder 120 may generate the first hit signal Hit1 based on a result of comparing the input column address ICA with the first fail column address FCA1. The first column decoder 120 may select redundancy memory cells, through the first redundancy column selection line RCSL1 by using the first hit signal Hit1, instead of memory cells corresponding to the first fail column address FCA1 among memory cells of the first region 111. That is, by using the first redundancy column selection line RCSL1, the first column decoder 120 may select, as redundancy memory cells, memory cells of the first region 111 other than memory cells indicated by the first fail column address FCA1.

The fail column address (FCA) write circuit 128 may write the first fail column address FCA1 and the second fail column address FCA2, which are transmitted from the anti-fuse array 160, to the first register 121 and the second register 122, respectively. The fail column address (FCA) write circuit 128 may write any other fail column addresses, which are transmitted from the anti-fuse array 160, to any other registers (not illustrated), in addition to the first fail column address (FCA1) and the second fail column address FCA2. For example, the fail column address (FCA) write circuit 128 may include a shift register which sequentially writes bits of a fail column address to a register.

The first column decoder 120 includes the fail column address (FCA) write circuit 128, but the second column decoder 130 does not include the fail column address (FCA) write circuit 128. The first column decoder 120 may share or merge a fail column address (FCA) write circuit writing the first fail column address FCA1 to the first register 121 and a fail column address (FCA) write circuit writing the second fail column address FCA2 to the second register 122.

The second column decoder 130 may include a second redundancy column selection line (RCSL) enable circuit 136 and a second column selection line (CSL) enable circuit 137. In an exemplary embodiment, it is assumed that at least one of memory cells which may be selected through a second column selection line CSL2 is a fail memory cell and a column address corresponding to the second column selection line CSL2 is stored in the second register 122 as the second fail column address FCA2. When a read command or a write command for the memory cells to be selected through the second column selection line CSL2 is input to the memory device 100, the compare circuit 125 may activate the second hit signal Hit2. When the second hit signal Hit2 generated by the compare circuit 125 of the first column decoder 120 is activated, the second redundancy column selection line (RCSL) enable circuit 136 may transmit a second redundancy column selection signal in an opposite direction to the Y-axis direction through a second redundancy column selection line RCSL2. That is, the second redundancy column selection line (RCSL) enable circuit 136 may be implemented identically to the first redundancy column selection line (RCSL) enable circuit 126 except that the second redundancy column selection line (RCSL) enable circuit 136 uses the second hit signal Hit2. When the second hit signal Hit2 is activated, the second column selection line (CSL) enable circuit 137 may not transmit a second column selection signal in the opposite direction to the Y-axis direction through the second column selection line CSL2.

Unlike the above assumption, when the second hit signal Hit2 is not activated and one of word lines of the second region 112 is activated by the row decoder 140, the second column selection line (CSL) enable circuit 137 may transmit the second column selection signal in the opposite direction of the Y-axis direction through the second column selection line CSL2. The second column selection line CSL2 of FIG. 2 is one of the second column selection lines CSL2s of FIG. 1. The second column selection line (CSL) enable circuit 137 may be implemented identically to the first column selection line (CSL) enable circuit 127.

In an exemplary embodiment, it is assumed that all the first hit signal Hit1 and the second hit signal Hit2 are deactivated and the same input column address ICA is respectively provided to each of the first column decoder 120 and the second column decoder 130. The first redundancy column selection line (RCSL) enable circuit 126 and the second redundancy column selection line (RCSL) enable circuit 136 do not operate. When one of word lines of the first region 111 is activated, the first column selection line (CSL) enable circuit 127 may transmit the first column selection signal in the Y-axis direction through the first column selection line CSL1. When one of word lines of the second region 112 is activated, the second column selection line (CSL) enable circuit 137 may transmit the second column selection signal in the opposite direction to the Y-axis direction through the second column selection line CSL2.

To sum up, the first column decoder 120 may generate the second hit signal Hit2 based on a result of comparing the input column address ICA with the second fail column address FCA2. The second column decoder 130 may select redundancy memory cells through the second redundancy column selection line RCSL2 by using the second hit signal Hit2, instead of memory cells corresponding to the second fail column address FCA2 among memory cells of the second region 112. That is, the second column decoder 130 may select, as redundancy memory cells, memory cells of the second region 112 other than memory cells that correspond to the second fail column address FCA2. When memory cells to be selected through the second column selection line CSL2 do not include a fail memory cell, the second column decoder 130 may select memory cells through the second column selection line CSL2.

The row decoder 140 may decode an input row address IRA and may generate row selection signals based on a result of the decoding. The row decoder 140 may transmit the row selection signals in an X-axis direction through the word lines WLs and may select memory cells corresponding to the input row address IRA. The row decoder 140 may drive the word lines WLs in the X-axis direction. Unlike the exemplary embodiments illustrated in FIGS. 1-2, in some exemplary embodiments in which the row decoder 140 is positioned on the left side of the bank 110, the row decoder 140 may drive the word lines WLs in an opposite direction to the X-axis direction. Data input/output associated with memory cells selected by the row decoder 140 may be performed by the first column decoder 120 and the second column decoder 130 depending on locations of the selected memory cells.

The command (CMD) decoder 150 may control the first column decoder 120, the second column decoder 130, and the row decoder 140 in response to commands and addresses CMDs/ADDs received from the outside of the memory device 100. The command (CMD) decoder 150 may control the first column decoder 120 and the second column decoder 130 in response to a read command, a write command, etc. and may transmit the input column address ICA to the first column decoder 120 and the second column decoder 130. The command (CMD) decoder 150 may control the row decoder 140 in response to an activate command, a precharge command, a refresh command, etc. and may transmit the input row address IRA to the row decoder 140. In an exemplary embodiment, the command (CMD) decoder 150 may be positioned more adjacent to the first column decoder 120 than the second column decoder 130, such that the first column decoder 120 is relatively closer to the command (CMD) decoder 150 than the second column decoder 130. Accordingly, the first column decoder 120 may be referred to as a "center column decoder", and the second column decoder 130 may be referred to as an "edge column decoder".

In an exemplary embodiment, the command (CMD) decoder 150 may generate a column selection line master signal CSLM in response to a read command or a write command. Unlike the example illustrated in FIGS. 1-2, in some exemplary embodiments, the column selection line master signal CSLM may be generated by the first column decoder 120. When the first hit signal Hit1 is not activated before the column selection line master signal CSLM is received, the first redundancy column selection line (RCSL) enable circuit 126 may not transmit a first redundancy column selection signal through the first redundancy column selection line RCSL1. As in the above description, when the second hit signal Hit2 is not activated before the column selection line master signal CSLM is received, the second redundancy column selection line (RCSL) enable circuit 136 may not transmit a second redundancy column selection signal through the second redundancy column selection line RCSL2.

In an exemplary embodiment, the command (CMD) decoder 150 may transmit the column selection line master signal CSLM to the first redundancy column selection line (RCSL) enable circuit 126 and the second redundancy column selection line (RCSL) enable circuit 136 through the row decoder 140 or the bank 110 so that a time at which the first redundancy column selection line (RCSL) enable circuit 126 receives the column selection line master signal CSLM is identical or similar to a time at which the second redundancy column selection line (RCSL) enable circuit 136 receives the column selection line master signal CSLM. Accordingly, a margin between the second hit signal Hit2 and the column selection line master signal CSLM when the second register 122 and the compare circuit 125 are positioned within the first column decoder 120 may be identical or similar to a margin between the second hit signal Hit2 and the column selection line master signal CSLM when the second register 122 and the compare circuit 125 are positioned within the second column decoder 130.

The anti-fuse array 160 may provide or transmit the first fail column address FCA1 and the second fail column address FCA2 to the fail column address (FCA) write circuit 128. The anti-fuse array 160 may include anti-fuses where the first fail column address FCA1 and the second fail column address FCA2 are programmed. An anti-fuse may be programmed from a high-resistance state to a low-resistance state (or vice versa). A program operation of the anti-fuse may be performed as a dielectric of the anti-fuse is ruptured or is not ruptured. Any other nonvolatile memory cell such as a one-time programmable (OTP) memory cell may be used instead of the anti-fuse. For example, the anti-fuse array 160 may permanently store fail row addresses FRAs and fail column addresses FCAs (including the first fail column address FCA1 and the second fail column address FCA2) of the memory device 100.

Figure 3:
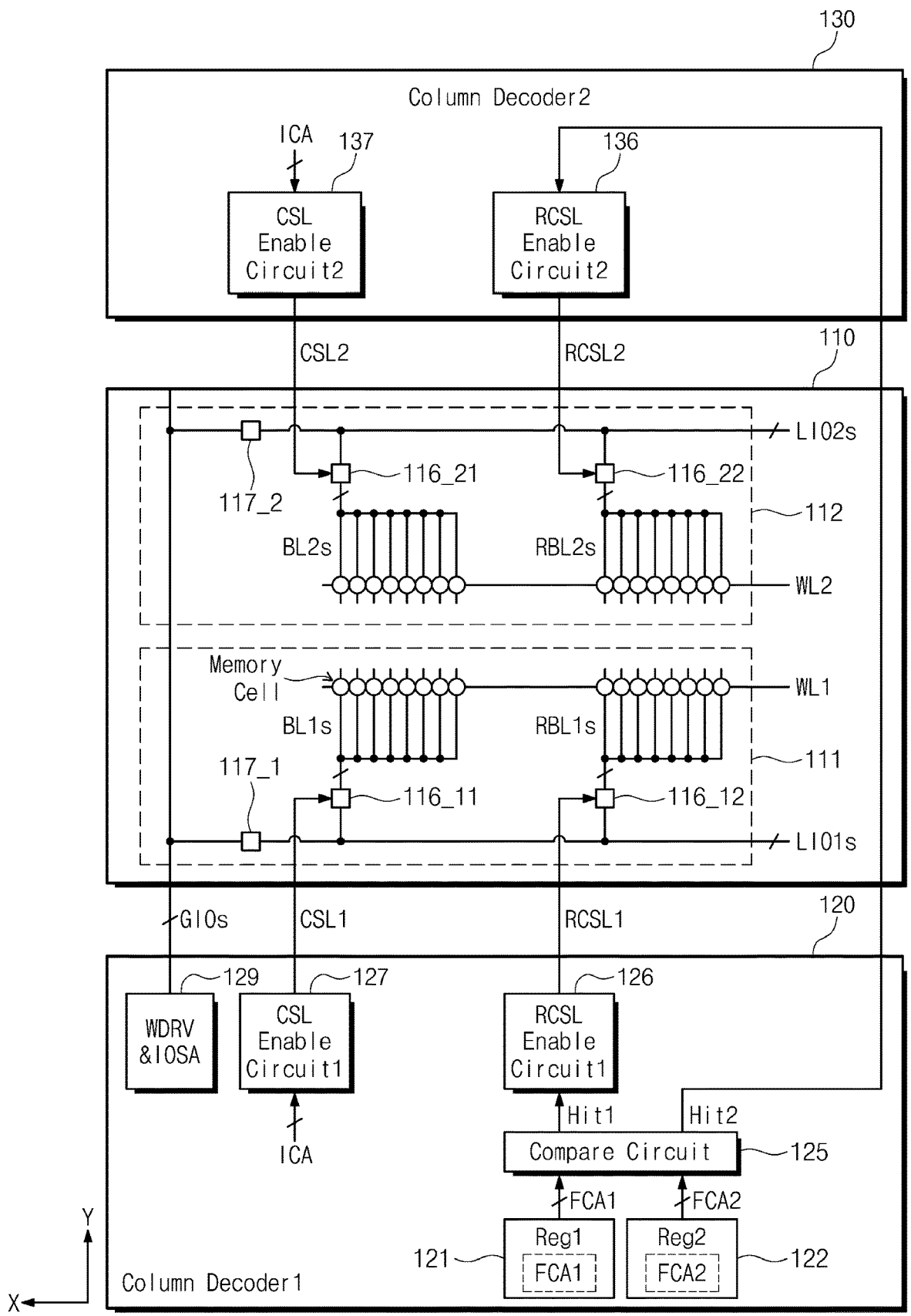
FIG. 3 is a block diagram illustrating a bank of the memory device of FIG. 1, according to an exemplary embodiment.

FIG. 3 is a block diagram illustrating a bank of a memory device of FIG. 1, according to an exemplary embodiment. FIG. 3 will be described together with reference to FIGS. 1 and 2. The memory device 100 may include the bank 110, the first column decoder 120, and the second column decoder 130. The first column decoder 120 and the second column decoder 130 are described above with reference to FIG. 1, and thus a repeated description will be omitted for conciseness.

Memory cells connected to a first word line WL1 may be arranged in the first region 111 of the bank 110. Memory cells connected to a second word line WL2 may be arranged in the second region 112 of the bank 110. The number of memory cells connected to each of the first word line WL1 and the second word line WL2 is only an example. One or more word lines may be further arranged in the first region 111 and the second region 112.

A switch 116_11 may electrically connect first bit lines BL1s and local input/output lines LIO1s depending on a voltage level of the first column selection line CSL1 or the first column selection signal. A switch 116_12 may electrically connect first redundancy bit lines RBL1s and the local input/output lines LIO1s depending on a voltage level of the first redundancy column selection line RCSL1 or the first redundancy column selection signal. A switch 116_21 may electrically connect second bit lines BL2s and local input/output lines LIO2s depending on a voltage level of the second column selection line CSL2 or the second column selection signal. A switch 116_22 may electrically connect second redundancy bit lines RBL2s and the local input/output lines LIO2s depending on a voltage level of the second redundancy column selection line RCSL2 or the second redundancy column selection signal. The switches 116_11, 116_12, 116_21, and 116_22 may be implemented identically to each other, and may include one or more NMOS transistors, one or more PMOS transistors, or combinations of NMOS transistors and PMOS transistors. The number of bit lines connected to each of the switches 116_11, 116_12, 116_21, and 116_22 illustrated in FIG. 3 is an example.

In an exemplary embodiment, the bank 110 may further include sense amplifiers (not illustrated) amplifying voltage differences between the first bit lines BL1s and the first bit bar lines BLB1s (not illustrated). The first bit lines BL1s and the first bit bar lines BLB1s (not illustrated) may be respectively positioned above and below the sense amplifiers according to an open bit line structure. Other bit lines RBL1s, BL2s, and RBL2s may be positioned identically to the first bit lines BL1s.

An input/output circuit 117_1 may perform data input/output between the local input/output lines LIO1s and global input/output lines GIOs. The input/output circuit 117_1 may include PMUXON transistors which provide write data transmitted through the global input/output lines GIOs to the local input/output lines LIO1s when the memory device 100 receives a write command. The input/output circuit 117_1 may include local sense amplifiers (LSAs) or switches which provide read data transmitted through the local input/output lines LIO1s to the global input/output lines GIOs when the memory device 100 receives a read command. An input/output circuit 117_2 may perform data input/output between the local input/output lines LIO2s and the global input/output lines GIOs. The input/output circuits 117_1 and 117_2 may be implemented substantially identically to each other.

The first column decoder 120 may further include a write driver and input/output sense amplifier (WDRV & IOSA) 129. The write driver and input/output sense amplifier (WDRV & IOSA) 129 may perform an operation of writing or reading data to or from memory cells through the global input/output lines GIOs, the input/output circuit 117_1, the local input/output lines LIO1s, the switch 116_11, and the first bit lines BL1s. When a fail memory cell is included in the above-described memory cells, through the global input/output lines GIOs, the input/output circuit 117_1, the local input/output lines LIO1s, the switch 116_12, and the first redundancy bit lines RBL1s, the write driver and input/output sense amplifier (WDRV & IOSA) 129 may write data to redundancy memory cells or may read data stored in the redundancy memory cells.

As in the above description, the write driver and input/output sense amplifier (WDRV & IOSA) 129 may perform an operation of writing or reading data to or from memory cells through the global input/output lines GIOs, the input/output circuit 117_2, the local input/output lines LIO2s, the switch 116_21, and the second bit lines BL2s. When a fail memory cell is included in the above-described memory cells; through the global input/output lines GIOs, the input/output circuit 117_2, the local input/output lines LIO2s, the switch 116_22, and the second redundancy bit lines RBL2s, the write driver and input/output sense amplifier (WDRV & IOSA) 129 may write data to redundancy memory cells or may read data stored in the redundancy memory cells.

To sum up, memory cells positioned in the second region 112 may be selected by the second column decoder 130, but data input/output associated with the memory cells positioned in the second region 112 may be performed by the first column decoder 120. Memory cells connected to the first word line WL1 and memory cells connected to the second word line WL2 may share the global input/output lines GIOs.

In an exemplary embodiment, the number of sets each composed of the global input/output lines GIOs and the write driver and input/output sense amplifier (WDRV & IOSA) 129 may be determined depending on the following conditions supported by the memory device 100: the number of data input/output pads, a burst length, etc. The number of sets each composed of the first column selection line CSL1 and the first column selection line (CSL) enable circuit 127 and the number of sets each composed of the second column selection line CSL2 and the second column selection line (CSL) enable circuit 137 may be determined depending on the following conditions of the memory device 100: a capacity, a page size, a range of column addresses, etc. Also, the bank 110 may further include memory cells, redundancy memory cells, bit lines, redundancy bit lines, switches, local input/output lines, input/output circuits, and global input/output lines, which are not illustrated in FIG. 3.

In an exemplary embodiment, when at least one of memory cells selected by the first word line WL1 and the first column selection line CSL1 is fail, the first fail column address FCA1 may be stored to the first register 121. When at least one of memory cells selected by the second word line WL2 and the second column selection line CSL2 is fail, the second fail column address FCA2 may be stored to the second register 122. In the case where a column address corresponding to the first column selection line CSL1 is identical to a column address corresponding to the second column selection line CSL2, the first fail column address FCA1 may be identical to the second fail column address FCA2. Of course, in the case where a column address corresponding to the first column selection line CSL1 is different from a column address corresponding to the second column selection line CSL2, the first fail column address FCA1 may be different from the second fail column address FCA2.

Figure 4:
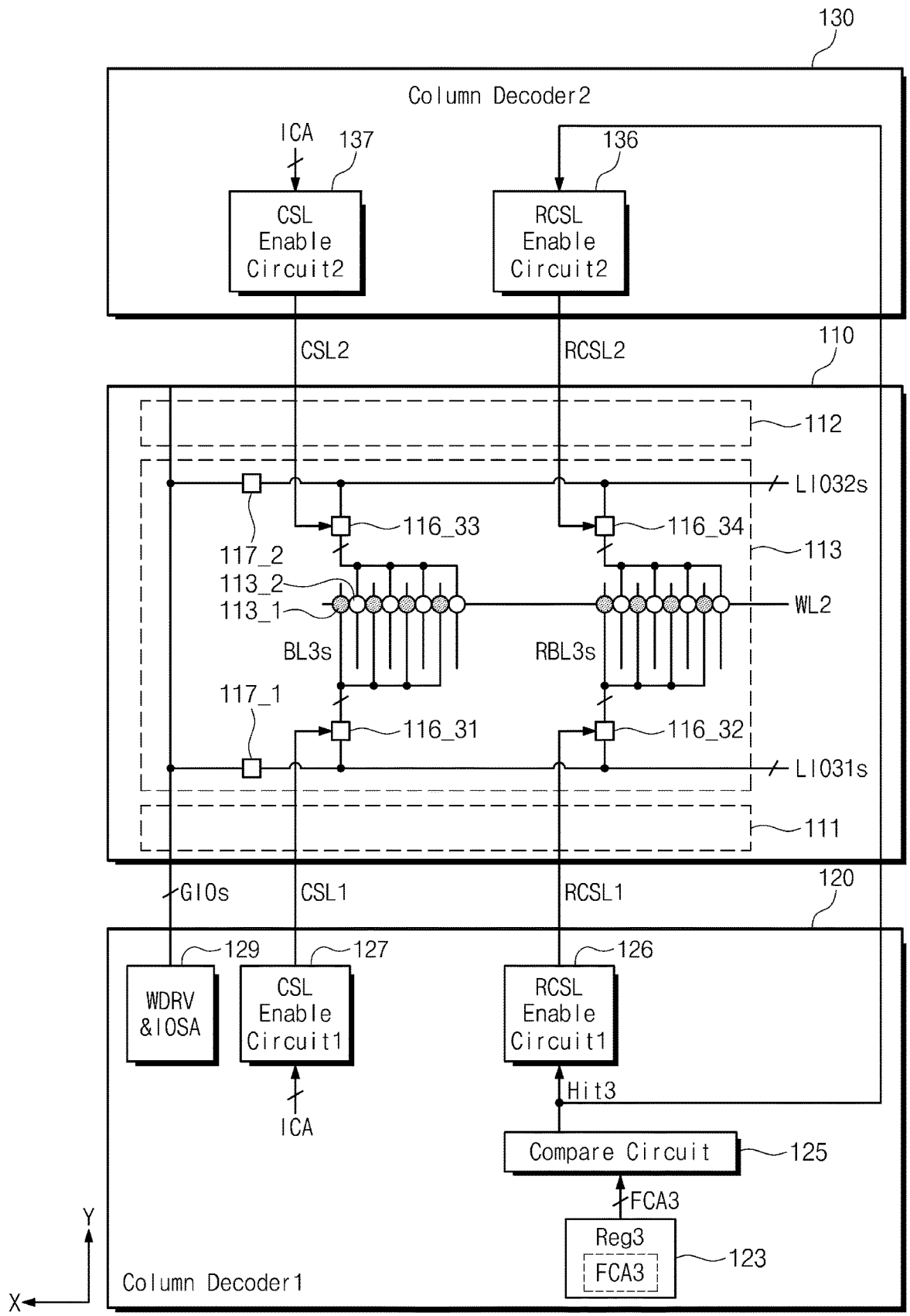
FIG. 4 is a block diagram illustrating the bank of FIG. 3 in detail, according to an exemplary embodiment.

FIG. 4 is a block diagram illustrating a bank of a memory device of FIG. 3 in detail, according to an exemplary embodiment. FIG. 4 will be described with reference to FIGS. 1 to 3. Memory cells of a third region 113 of the bank 110 may be positioned between the first region 111 and the second region 112 and in a center region of the bank 110 with respect to the Y-axis.

Memory cells of the first region 111 may be selected only by the first column decoder 120. Memory cells of the second region 112 may be selected only by the second column decoder 130. In contrast, the memory cells of the third region 113 may be selected by the first column decoder 120 or the second column decoder 130. Memory cells 113_1 of memory cells connected to a third word line WL3 may be selected by the first column decoder 120 and memory cells 113_2 of the memory cells connected to the third word line WL3 may be selected by the second column decoder 130.

As in the memory cells of the first region 111 and the second region 112, the write driver and input/output sense amplifier (WDRV & IOSA) 129 may perform data input/output on the memory cells of the third region 113. However, the write driver and input/output sense amplifier (WDRV & IOSA) 129 may perform data input/output on the memory cells connected to the third word line WL3 through the global input/output lines GIOs, the input/output circuits 117_1 and 117_2, local input/output lines LIO31s and LIO32s, switches 116_31 and 116_33, and third bit lines BL3s. When a fail memory cell is included in the above-described memory cells, the write driver and input/output sense amplifier (WDRV & IOSA) 129 may perform data input/output on redundancy memory cells connected to the third word line WL3 through the global input/output lines GIOs, the input/output circuits 117_1 and 117_2, the local input/output lines LIO31s and LIO32s, switches 116_32 and 116_34, and third redundancy bit lines RBL3s.

The memory cells of the third region 113 may be a part of the bank 110, and may be arranged substantially identically to the memory cells of the first region 111 and the second region 112. The first column decoder 120 and the second column decoder 130 should operate for selecting the memory cells of the third region 113. For example, to select the memory cells connected to the third word line WL3 after the third word line WL3 is activated, the first column selection line (CSL) enable circuit 127 and the second column selection line (CSL) enable circuit 137 may simultaneously drive the first column selection line CSL1 and the second column selection line CSL2.

It is assumed that memory cells selected by the third word line WL3 and the first column selection line CSL1 and the second column selection line CSL2 include at least one fail memory cell and the fail memory cell is repaired by activating or selecting the first redundancy column selection line RCSL1 and the second redundancy column selection line RCSL2 instead of the first column selection line CSL1 and the second column selection line CSL2 (i.e., a column repair). In this case, the first column decoder 120 may not need to include both a register storing a column address corresponding to the first column selection line CSL1 and a register storing a column address corresponding to the second column selection line CSL2 and may share or merge the registers. Since the first column selection line CSL1 and the second column selection line CSL2 are simultaneously activated, the first column decoder 120 may further include a third register 123 storing a column address corresponding to the first column selection line CSL1 and the second column selection line CSL2 as a third fail column address FCA3. Here, the first to third fail column addresses FCA1 to FCA3 may be identical to or different from each other. The third register 123 may receive, from the row decoder 140, a signal indicating whether one of word lines belonging to the third region 113 is activated, and then may provide the third fail column address FCA3 to the compare circuit 125.

The compare circuit 125 may generate a third hit signal Hit3 when the input column address ICA is matched with the third fail column address FCA3. The first redundancy column selection line (RCSL) enable circuit 126 and the second redundancy column selection line (RCSL) enable circuit 136 may respectively activate the first redundancy column selection line RCSL1 and the second redundancy column selection line RCSL2 by using the third hit signal Hit3. The first column selection line (CSL) enable circuit 127 and the second column selection line (CSL) enable circuit 137 may not activate the first column selection line CSL1 and the second column selection line CSL2 based on the third hit signal Hit3 which is activated.

To sum up, the first column decoder 120 may generate the third hit signal Hit3 based on a result of comparing the input column address ICA with the third fail column address FCA3. The first column decoder 120 may select redundancy memory cells through the first redundancy column selection line RCSL1 by using the third hit signal Hit3, instead of memory cells corresponding to the third fail column address FCA3 among the memory cells 113_1 of the third region 113. That is, the first column decoder 120 may select, as redundancy memory cells, memory cells of the third region 113 other than memory cells that correspond to the third fail column address FCA3. The second column decoder 130 may select redundancy memory cells through the second redundancy column selection line RCSL2 by using the third hit signal Hit3, instead of memory cells corresponding to the third fail column address FCA3 among the memory cells 113_2 of the third region 113. That is, the second column decoder 130 may select, as redundancy memory cells, memory cells of the third region 113 other than memory cells that correspond to the third fail column address FCA3.

Figure 5:
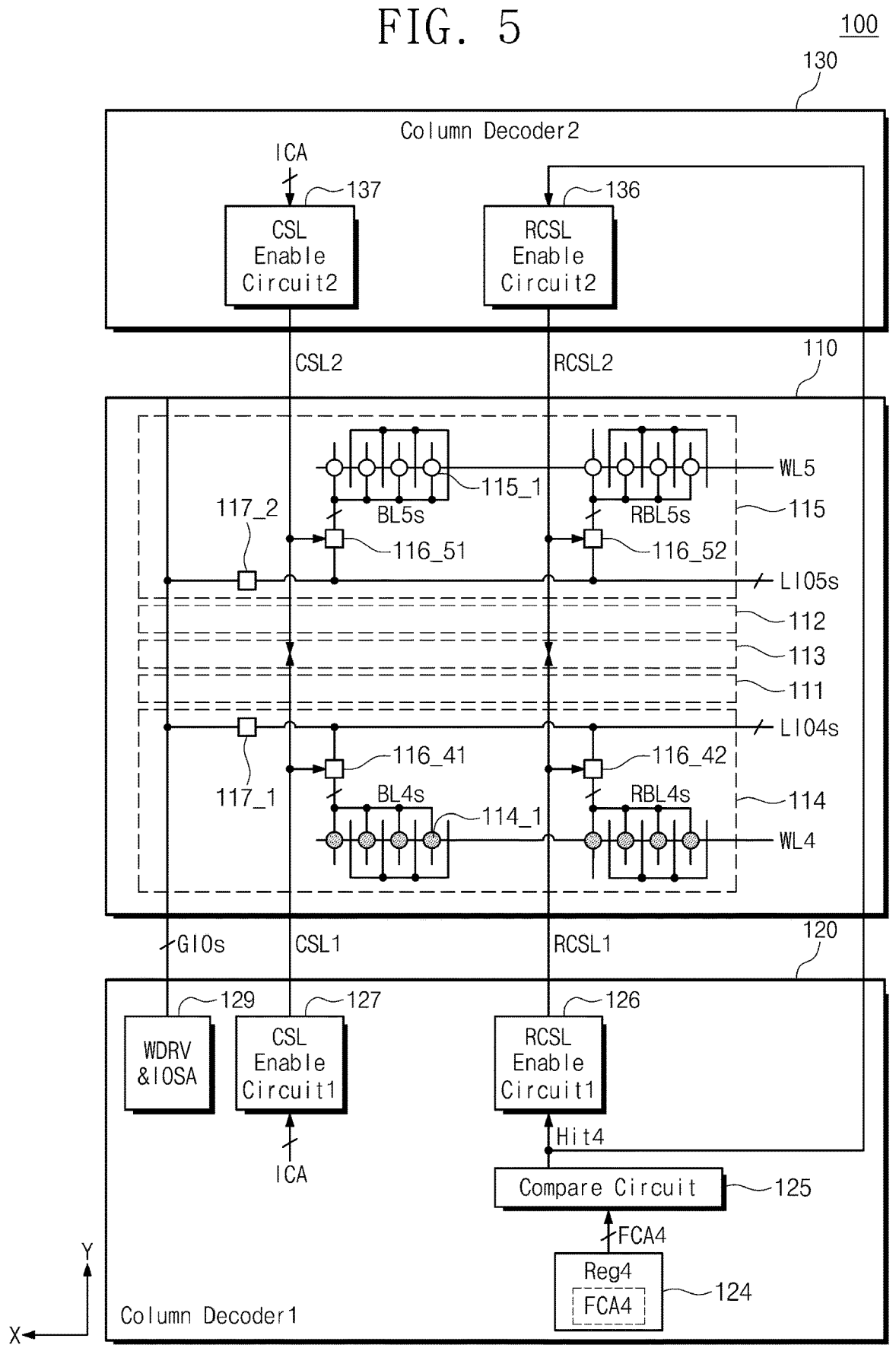
FIG. 5 is a block diagram illustrating the bank of FIG. 4 in detail, according to an exemplary embodiment.

FIG. 5 is a block diagram illustrating a bank of a memory device of FIG. 4 in detail, according to an exemplary embodiment. FIG. 5 will be described with reference to FIGS. 1 to 4. Memory cells of a fourth region 114 of the bank 110 may be positioned adjacent to the first column decoder 120. Memory cells of a fifth region 115 of the bank 110 may be positioned adjacent to the second column decoder 130. The memory cells of the fourth region 114 and the memory cells of the fifth region 115 may be respectively positioned at edge regions of the bank 110 with respect to the Y-axis.

The memory cells of the fourth region 114 may be selected by the first column decoder 120. The memory cells of the fifth region 115 may be selected by the second column decoder 130. However, according to the above-described open bit line structure, each of the number of memory cells connected to a fourth word line WL4 of the fourth region 114 and the number of memory cells connected to a fifth word line WL5 of the fifth region 115 may be, for example, half the number of memory cells connected to any word line of the first to third regions 111 to 113. The memory cells of the fourth region 114 and the memory cells of the fifth region 115 may be selected together. The row decoder 140 of FIG. 2 may simultaneously activate the fourth word line WL4 and the fifth word line WL5 in response to an activate command or a refresh command. The first column decoder 120 and the second column decoder 130 may simultaneously drive the first column selection line CSL1 and the second column selection line CSL2.

As in the memory cells of the first to third regions 111 to 113, the write driver and input/output sense amplifier (WDRV & IOSA) 129 may perform data input/output on memory cells of the fourth region 114 and the fifth region 115. The write driver and input/output sense amplifier (WDRV & IOSA) 129 may perform data input/output on the memory cells connected to the fourth word line WL4 and the fifth word line WL5 through the global input/output lines GIOs, the input/output circuits 117_1 and 117_2, local input/output lines LIO4s and LIO5s, switch 116_41 and 116_51, and fourth bit lines BL4s and the fifth bit lines BL5s. When a fail memory cell is included in the above-described memory cells, the write driver and input/output sense amplifier (WDRV & IOSA) 129 may perform data input/output on redundancy memory cells connected to the fourth word line WL4 and the fifth word line WL5 through the global input/output lines GIOs, the input/output circuits 117_1 and 117_2, the local input/output lines LIO4s and LIO5s, switch 116_42 and 116_52, and fourth redundancy bit lines RBL4s and the fifth redundancy bit lines RBL5s.

It is assumed that at least one of memory cells selected by the fourth word line WL4 and the fifth word line WL5 and the first column selection line CSL1 and the second column selection line CSL2 is fail and the fail memory cell is repaired by activating the first redundancy column selection line RCSL1 and the second redundancy column selection line RCSL2 instead of the first column selection line CSL1 and the second column selection line CSL2 (i.e., a column repair). In this case, the first column decoder 120 may not need to include both a register storing a column address corresponding to the first column selection line CSL1 and a register storing a column address corresponding to the second column selection line CSL2 and may share or merge the registers. Since the first column selection line CSL1 and the second column selection line CSL2 are simultaneously activated, the first column decoder 120 may further include a fourth register 124 storing a column address corresponding to the first column selection line CSL1 and the second column selection line CSL2 as a fourth fail column address FCA4. Here, the fourth fail column address FCA4 may be identical to the first to third fail column addresses FCA1 to FCA3, may be identical to a part of the first to third fail column addresses FCA1 to FCA3, or may be different from the first to third fail column addresses FCA1 to FCA3. The fourth register 124 may receive, from the row decoder 140, a signal indicating whether a part of word lines belonging to the fourth region 114 and the fifth region 115 is activated, and then may provide the fourth fail column address FCA4 to the compare circuit 125.

The compare circuit 125 may generate a fourth hit signal Hit4 when the input column address ICA is matched with the fourth fail column address FCA4. The first redundancy column selection line (RCSL) enable circuit 126 and the second redundancy column selection line (RCSL) enable circuit 136 may respectively activate the first redundancy column selection line RCSL1 and the second redundancy column selection line RCSL2 by using the fourth hit signal Hit4. The first column selection line (CSL) enable circuit 127 and the second column selection line (CSL) enable circuit 137 may not activate the first column selection line CSL1 and the second column selection line CSL2 based on the fourth hit signal Hit4 which is activated.

To sum up, the first column decoder 120 may generate the fourth hit signal Hit4 based on a result of comparing the input column address ICA with the fourth fail column address FCA4. The first column decoder 120 may select redundancy memory cells through the first redundancy column selection line RCSL1 by using the fourth hit signal Hit4, instead of memory cells corresponding to the fourth fail column address FCA4 among memory cells 114_1 of the fourth region 114. That is, the first column decoder 120 may select, as redundancy memory cells, memory cells of the fourth region 114 other than memory cells corresponding to the fourth fail column address FCA4. The second column decoder 130 may select redundancy memory cells through the second redundancy column selection line RCSL2 by using the fourth hit signal Hit4, instead of memory cells corresponding to the fourth fail column address FCA4 among memory cells 115_1 of the fifth region 115. That is, the second column decoder 130 may select, as redundancy memory cells, memory cells of the fifth region 115 other than memory cells corresponding to the fourth fail column address FCA4.

Figure 6:
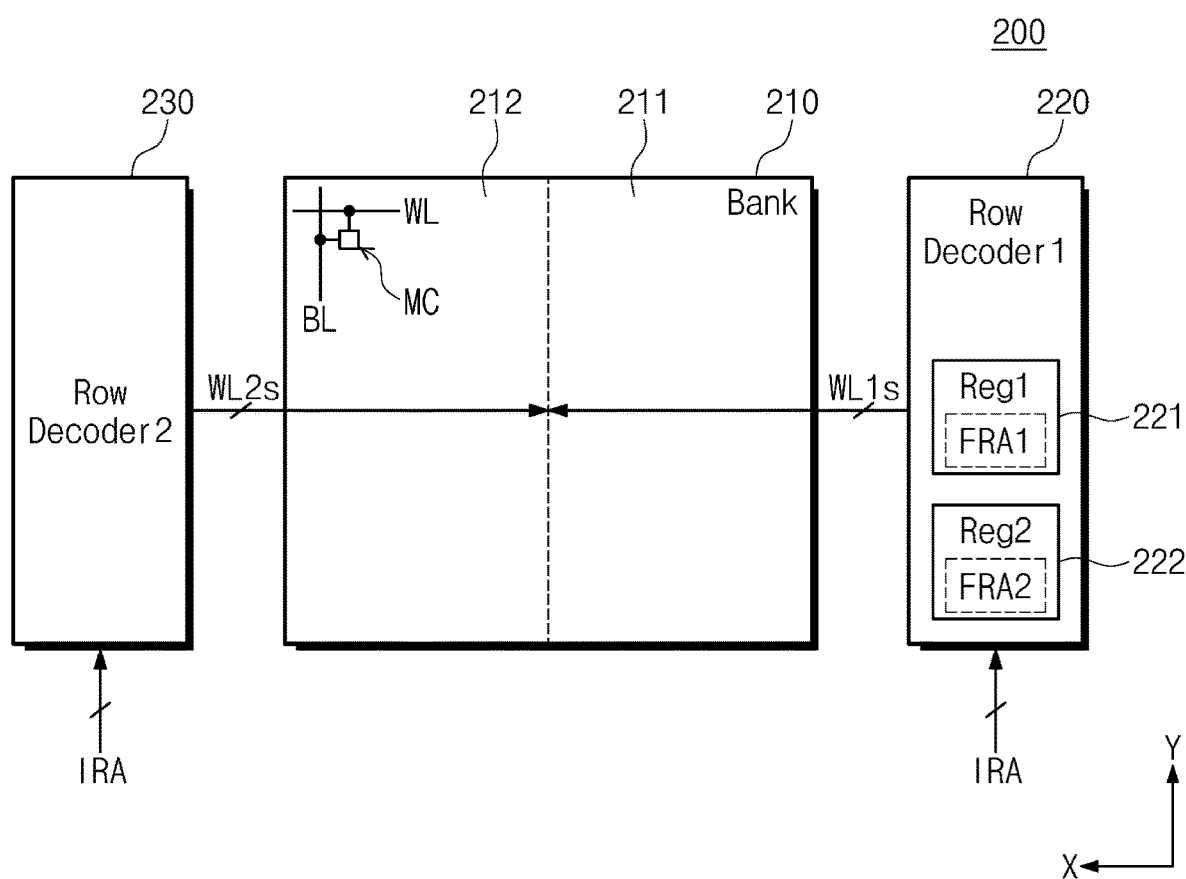
FIG. 6 is a block diagram illustrating a memory device according to another exemplary embodiment.

FIG. 6 is a block diagram illustrating a memory device according to another exemplary embodiment. A memory device 200 may include a bank 210, a first row decoder 220, and a second row decoder 230. The bank 210 may be substantially identical to a memory cell array described with reference to FIG. 1.

The bank 210 may include a first region 211 which is accessed by the first row decoder 220 and a second region 212 which is accessed by the second row decoder 230. Memory cells which are selected by the first row decoder 220 may be arranged in the first region 211. Memory cells which are selected by the second row decoder 230 may be arranged in the second region 212. Memory cells of the bank 210 may be divided into the first region 211 and the second region 212 on the basis of the X-axis direction and the opposite direction to the X-axis direction, which are directions in which the first row decoder 220 and the second row decoder 230 are respectively driven.

The first row decoder 220 may decode the input row address IRA and may generate first row selection signals based on a result of the decoding. The first row decoder 220 may transmit the first row selection signals in the X-axis direction through the first word lines WL1s and may select memory cells. The first row decoder 220 may drive the first word lines WL1s in the X-axis direction. The second row decoder 230 may decode the input row address IRA and may generate second row selection signals based on a result of the decoding; the second row decoder 230 may transmit the second row selection signals in the opposite direction of the X-axis direction and may select memory cells. The second row decoder 230 may drive the second word lines WL2s in the opposite direction to the X-axis direction. Input row addresses which the first row decoder 220 and the second row decoder 230 receive may be identical to each other.

In a related art case where the bank 210 is driven only by the first row decoder 220 without the second row decoder 230, the first row decoder 220 should select memory cells of the second region 212 as well as memory cells of the first region 211, that is, all memory cells of the bank 210. To this end, the first row decoder 220 should drive word lines, the lengths of which correspond to a horizontal length (i.e., a length on the X-axis) of the bank 210. However, as the size of the bank 210 increases, loads of the word lines of the first row decoder 220 may increase. In particular, since voltages of the word lines are used to turn on or turn off cell transistors, the voltages may transition, for example, from a voltage lower than a ground voltage to a voltage higher than a power supply voltage, or the vice versa. That is, as the size of the bank 210 increases, the driving ability of the first row decoder 220 with regard to the word lines may become worse. The memory device 200 according to an exemplary embodiment may include the first row decoder 220 and the second row decoder 230 which drive one bank 210 in two directions (e.g., in opposite directions). As in the first column decoder 120 and the second column decoder 130, the first row decoder 220 and the second row decoder 230 may be opposite to each other with respect to the bank 210 or may face each other with respect to the bank 210. The bank 210 may be interposed between the first row decoder 220 and the second row decoder 230.

Referring to FIG. 6, the first row decoder 220 may include a first register 221 storing a first fail row address FRA1 for repairing first word lines WL1s. When the input row address IRA is matched with the first fail row address FRA1, the first row decoder 220 may drive redundancy word lines instead of word lines (some of the first word lines WL1s) corresponding to the input row address IRA matched with the first fail row address FRA1.

The first row decoder 220 may include a second register 222 storing a second fail row address FRA2 for repairing second word lines WL2s, as well as the first register 221. When the input row address IRA is matched with the second fail row address FRA2, the second row decoder 230 may drive redundancy word lines (not illustrated) instead of word lines (some of the second word lines WL2s) corresponding to the input row address IRA matched with the second fail row address FRA2.

The first row decoder 220 may include both the first register 221 for repairing the first word lines WL1s and the second register 222 for repairing the second word lines WL2s. Accordingly, the first row decoder 220 may share or merge write circuits which write the first fail row address FRA1 and the second fail row address FRA2 to the first register 221 and the second register 222, respectively. Also, the first row decoder 220 may share or merge a compare circuit comparing the input row address IRA with the first fail row address FRA1 and a compare circuit comparing the input row address IRA with the second fail row address FRA2. The second row decoder 230 may not include the second register 222. The area of the memory device 200 may decrease by sharing the write circuit and the compare circuits and simplifying the second row decoder 230.

Figure 7:
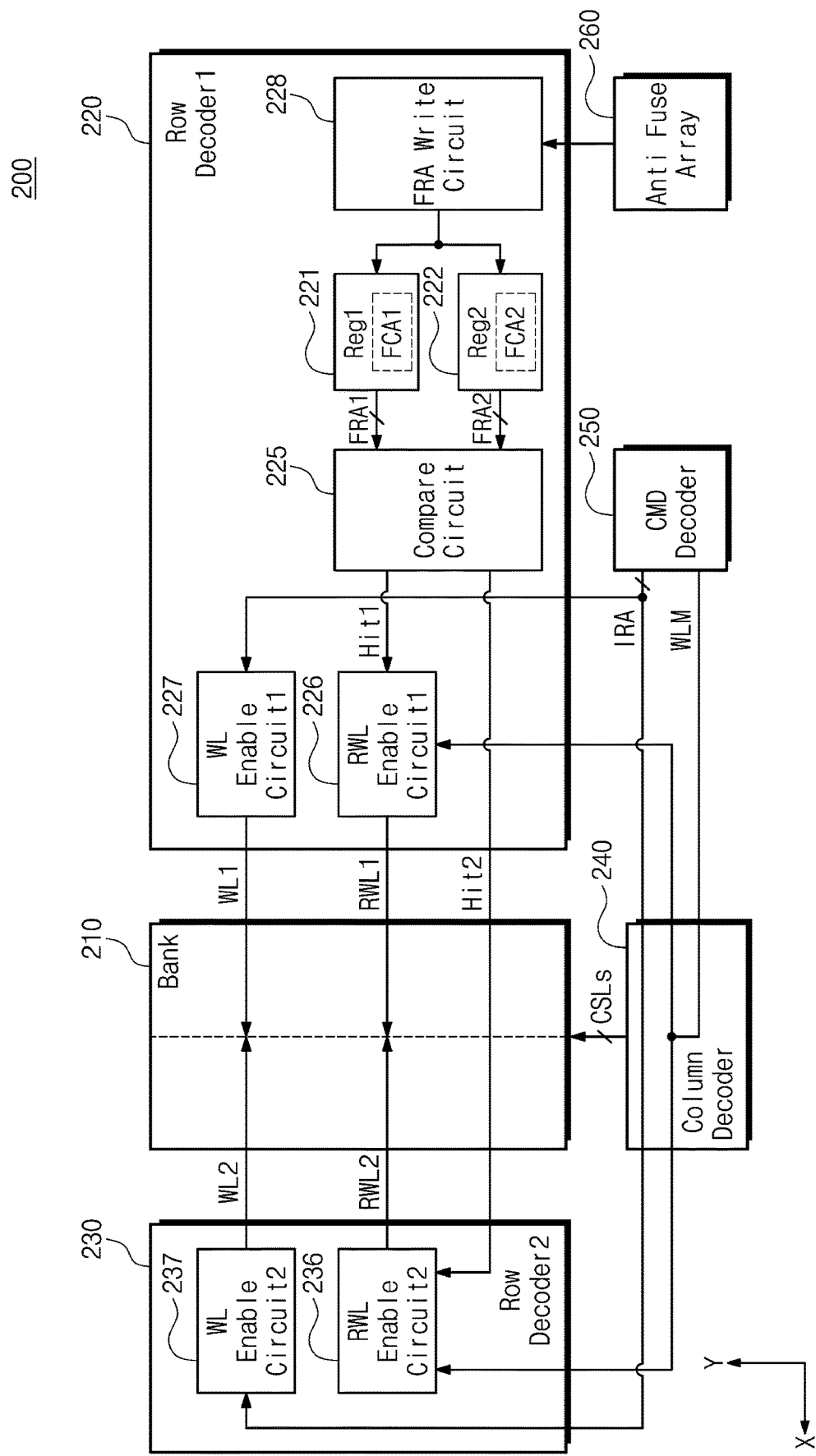
FIG. 7 is a block diagram illustrating a first row decoder and a second row decoder of the memory device of FIG. 6, according to an exemplary embodiment.

FIG. 7 is a block diagram illustrating first and second row decoders of a memory device of FIG. 6. FIG. 7 will be described with reference to FIG. 6. The memory device 200 may include the bank 210, the first row decoder 220, the second row decoder 230, a column decoder 240, a command (CMD) decoder 250, and an anti-fuse array 260. The bank 210 is described with reference to FIG. 1, and thus a repeated description is omitted for conciseness.

The first row decoder 220 may include the first register 221, the second register 222, a compare circuit 225, a first redundancy word line (RWL) enable circuit 226, a first word line (WL) enable circuit 227, and a fail row address (FRA) write circuit 228. The first register 221 and the second register 222 are described with reference to FIG. 6, and thus a repeated description will be omitted for conciseness. As in the memory device 100 of FIG. 2, the memory device 200 may include the compare circuit 225. In some exemplary embodiments, the second row decoder 230 does not include a compare circuit.

The compare circuit 225 may function in a similar manner to the compare circuit 125 of FIG. 2. The compare circuit 225 may compare the input row address IRA with the first fail row address FRA1 and may compare the input row address IRA with the second fail row address FRA2. For example, the above-described comparison operations may be performed at the same time. The first register 221 and the second register 222 may provide the first fail row address FRA1 and the second fail row address FRA2 to the compare circuit 225 under control of the command (CMD) decoder 250 which operates in response to an activate command or a refresh command. The compare circuit 225 may generate a first hit signal Hit1 when the input row address IRA is matched with the first fail row address FRA1. The compare circuit 225 may generate a second hit signal Hit2 when the input row address IRA is matched with the second fail row address FRA2.

In an exemplary embodiment, the compare circuit 225 may transmit the second hit signal Hit2 to the second row decoder 230. Similar to the first column decoder 120 of FIG. 2, the first row decoder 220 may include one or more first registers 221 and one or more second registers 222. For example, in the case where the first registers 221 and the second registers 222 are distributed and positioned within the first row decoder 220, the compare circuit 225 may transmit the second hit signal Hit2 to the second row decoder 230 across/through the bank 210. For another example, in the case where the first registers 221 and the second registers 222 are intensively positioned within a region adjacent to both the first row decoder 220 and the column decoder 240, the compare circuit 225 may transmit the second hit signal Hit2 to the second row decoder 230 across/through the column decoder 240.

In an exemplary embodiment, the first row decoder 220 may include one or more compare circuits 225 depending on the number of the first registers 221 and the second registers 222. For convenience of description, an example is illustrated in FIG. 7 in which only one second hit signal Hit2 is transmitted to the second row decoder 230. However, the one or more compare circuits 225 may transmit one or more second hit signals (i.e., a second hit bus) to the second row decoder 230.

The first redundancy word line (RWL) enable circuit 226 and the first word line (WL) enable circuit 227 may operate similarly to the first redundancy column selection line (RCSL) enable circuit 126 and the first column selection line (CSL) enable circuit 127. When the first hit signal Hit1 is activated, the first redundancy word line (RWL) enable circuit 226 may transmit a first redundancy row selection signal in the X-axis direction through a first redundancy word line RWL1 and may activate the first redundancy word line RWL1 in the X-axis direction. When the first hit signal Hit1 is activated, the first word line (WL) enable circuit 227 may not activate the first word line WL1. When the first hit signal Hit1 is not activated, depending on the input row address IRA, the first word line (WL) enable circuit 227 may transmit a first row selection signal in the X-axis direction through the first word line WL1 and may activate the first word line WL1 in the X-axis direction. The first word line WL1 of FIG. 7 may be one of the first word lines WL1s of FIG. 6.

In an exemplary embodiment, it is assumed that at least one of memory cells which may be selected by the first word line WL1 is fail and a row address corresponding to the first word line WL1 is stored in the first register 221 as the first fail row address FRA1. Even through an activate command or a refresh command for the memory cells selected through the first word line WL1 is input to the memory device 200, since the compare circuit 225 activates the first hit signal Hit1, the first word line (WL) enable circuit 227 does not activate the first word line WL1.

To sum up, the first row decoder 220 may generate the first hit signal Hit1 based on a result of comparing the input row address IRA with the first fail row address FRA1. The first row decoder 220 may select redundancy memory cells connected to the first redundancy word line RWL1 by using the first hit signal Hit1, instead of memory cells corresponding to the first fail row address FRA1 among memory cells of the first region 211. That is, the first row decoder 220 may select, as redundancy memory cells, memory cells of the first region 211 other than memory cells that correspond to the first fail row address FRA1. When memory cells connected to the first word line WL1 corresponding to the input row address IRA do not include a fail memory cell, the first row decoder 220 may select the memory cells connected to the first word line WL1.

The fail row address (FRA) write circuit 228 may write the first fail row address FRA1 and the second fail row address FRA2, which are transmitted from the anti-fuse array 260, to the first register 221 and the second register 222, respectively. An operation of the fail row address (FRA) write circuit 228 may be similar to the operation of the fail column address (FCA) write circuit 128 of FIG. 2, and repeated discussion is omitted for conciseness.

The second row decoder 230 may include a second redundancy word line (RWL) enable circuit 236 and a second word line (WL) enable circuit 237. When the second hit signal Hit2 generated by the compare circuit 225 of the first row decoder 220 is activated, the second redundancy word line (RWL) enable circuit 236 may transmit a second redundancy row selection signal in the opposite direction to the X-axis direction through a second redundancy word line RWL2 and may drive the second redundancy word line RWL2 in the opposite direction to the X-axis direction. The second redundancy word line (RWL) enable circuit 236 may be implemented identically to the first redundancy word line (RWL) enable circuit 226 except that the second redundancy word line (RWL) enable circuit 236 uses the second hit signal Hit2.

When the second hit signal Hit2 is activated, the second word line (WL) enable circuit 237 may not activate the second word line WL2. When the second hit signal Hit2 is not activated, depending on the input row address IRA, the second word line (WL) enable circuit 237 may transmit the second row selection signal in the opposite direction to the X-axis direction through the second word line WL2 and may activate the second word line WL2 in the opposite direction to the X-axis direction. The second word line WL2 of FIG. 7 may be one of the second word lines WL2s of FIG. 6. The second word line (WL) enable circuit 237 may be implemented identically to the first word line (WL) enable circuit 227 except that the second word line (WL) enable circuit 237 uses the second hit signal Hit2.

It is assumed that at least one of memory cells which may be selected by the second word line WL2 is fail and a row address corresponding to the second word line WL2 is stored in the second register 222 as the second fail row address FRA2. Even through an activate command or a refresh command for the memory cells selected through the second word line WL2 is input to the memory device 200, since the compare circuit 225 activates the second hit signal Hit2, the second word line (WL) enable circuit 237 does not transmit a second row selection signal through the second word line WL2.

To sum up, the first row decoder 220 may generate the second hit signal Hit2 based on a result of comparing the input row address IRA with the second fail row address FRA2. The second row decoder 230 may select redundancy memory cells connected to the second redundancy word line RWL2 by using the second hit signal Hit2, instead of memory cells corresponding to the second fail row address FRA2 among memory cells of the second region 212. That is, the second row decoder 230 may select, as redundancy memory cells, memory cells of the second region 212 other than memory cells that correspond to the second fail row address FRA2. When memory cells connected to the second word line WL2 corresponding to the input row address IRA do not include a fail memory cell, the second row decoder 230 may select the memory cells connected to the second word line WL2.

Similar to the first column decoder 120, the column decoder 240 may decode the input column address ICA and may generate column selection signals based on a result of the decoding. The column decoder 240 may transmit the column selection signals in the Y-axis direction through column selection lines CSLs. The column decoder 240 may drive the column selection lines CSLs in the Y-axis direction. Data input/output may be performed on memory cells selected by the first row decoder 220 and the second row decoder 230 and the column decoder 240.

An operation of the command (CMD) decoder 250 may be similar to the operation of the command (CMD) decoder 150 of FIG. 2. The command (CMD) decoder 250 may generate a word line master signal WLM in response to an activate command or a refresh command. Unlike the examples illustrated in FIGS. 6-7, the word line master signal WLM may be generated by the first row decoder 220. When the first hit signal Hit1 is not activated before the word line master signal WLM is received, the first redundancy word line (RWL) enable circuit 226 may not transmit a first redundancy row selection signal through the first redundancy word line RWL1. As in the above description, when the second hit signal Hit2 is not activated before the word line master signal WLM is received, the second redundancy word line (RWL) enable circuit 236 may not transmit a second redundancy row selection signal through the second redundancy word line RWL2.

In an exemplary embodiment, the command (CMD) decoder 250 may transmit the word line master signal WLM to the first redundancy word line (RWL) enable circuit 226 and the second redundancy word line (RWL) enable circuit 236 through the column decoder 240 or the bank 210 so that a time at which the first redundancy word line (RWL) enable circuit 226 receives the word line master signal WLM is identical or similar to a time at which the second redundancy word line (RWL) enable circuit 236 receives the word line master signal WLM. The second redundancy word line (RWL) enable circuit 236 may respectively receive the second hit signal Hit2 and the word line master signal WLM passing through the bank 210 or the column decoder 240. Accordingly, a margin between the second hit signal Hit2 and the word line master signal WLM when the second register 222 and the compare circuit 225 are positioned within the first row decoder 220 may be identical or similar to a margin between the second hit signal Hit2 and the word line master signal WLM when the second register 222 and the compare circuit 225 are positioned within the second row decoder 230.

In an exemplary embodiment, the command (CMD) decoder 250 may be positioned more adjacent to the first row decoder 220 than the second row decoder 230, such that the first row decoder 220 is relatively closer to the command (CMD) decoder 250 than the second row decoder 230. Accordingly, the first row decoder 220 may be referred to as a "center row decoder", and the second row decoder 230 may be referred to as an "edge row decoder".

The anti-fuse array 260 may provide or transmit the first fail row address FRA1 and the second fail row address FRA2 to the fail row address (FRA) write circuit 228. An operation of the anti-fuse array 260 may be similar to the operation of the anti-fuse array 160 of FIG. 2, and thus a repeated description is omitted for conciseness.

Figure 8:
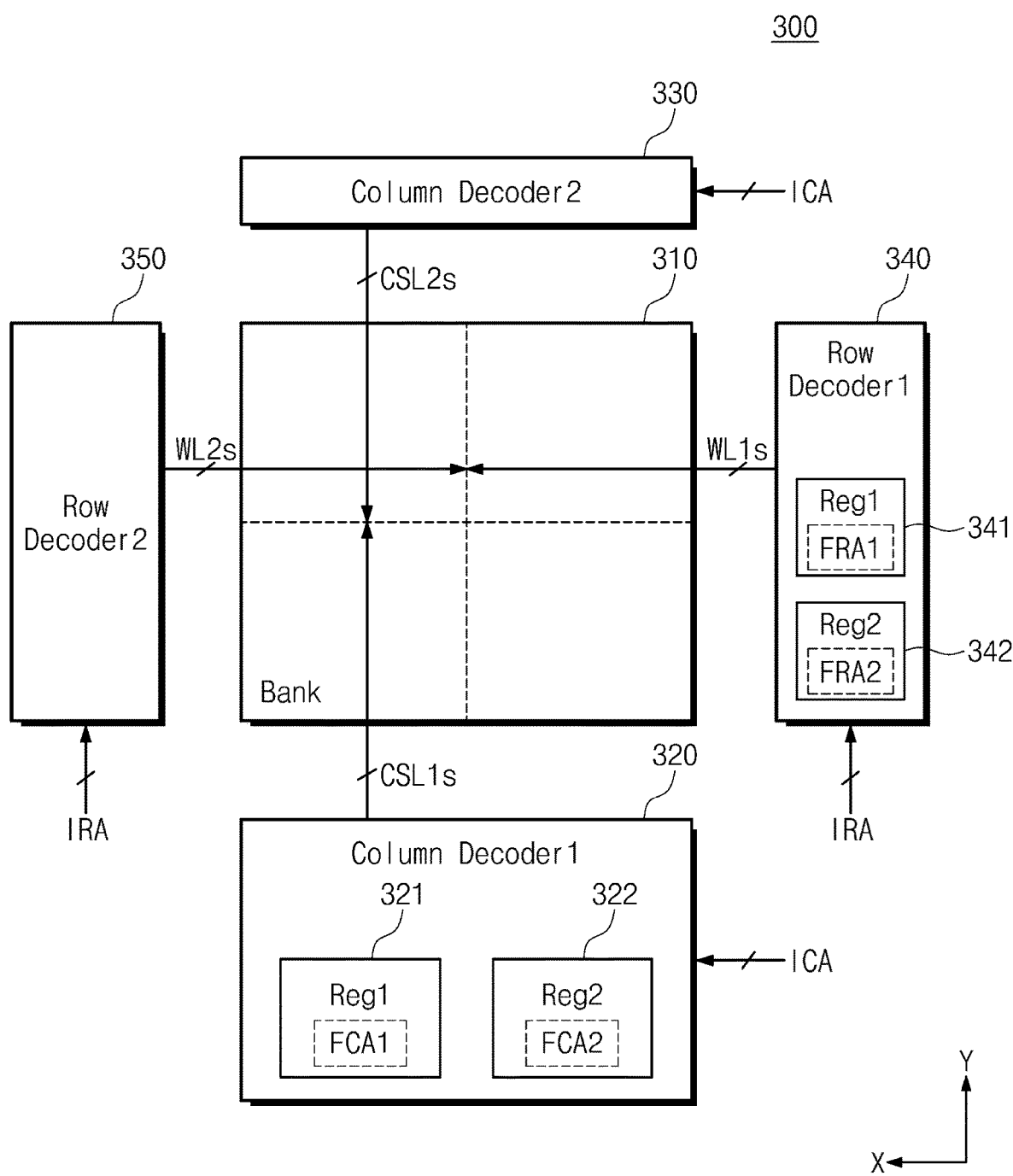
FIG. 8 is a block diagram illustrating a memory device according to another exemplary embodiment.

FIG. 8 is a block diagram illustrating a memory device according to another exemplary embodiment. FIG. 8 will be described with reference to FIGS. 1 to 7. A memory device 300 may include a bank 310, a first column decoder 320, a second column decoder 330, a first row decoder 340, and a second row decoder 350. Memory cells of the bank 310 may be divided into regions which are selected by the first column decoder 320 and the second column decoder 330, and the first row decoder 340 and the second row decoder 350. The bank 310 may be a memory cell array described with reference to FIG. 1, and thus a repeated description is omitted for conciseness.

The first column decoder 320 may include a first register 321 and a second register 322 which store a first fail column address FCA1 and a second fail column address FCA2, respectively. The first column decoder 320 and the second column decoder 330 may be substantially identical to the first column decoder 120 and the second column decoder 130 described with reference to FIGS. 1 to 5 and may be opposite to each other with respect to the bank 310 or may face each other with respect to the bank 310. The bank 310 may be interposed between the first column decoder 320 and the second column decoder 330. The first row decoder 340 may include a first register 341 and a second register 342 which store a first fail row address FRA1 and a second fail row address FRA2, respectively. The first row decoder 340 and the second row decoder 350 may be substantially identical to the first row decoder 220 and the second row decoder 230 described with reference to FIGS. 6 and 7 and may be opposite to each other with respect to the bank 310 or may face each other with respect to the bank 310. The bank 310 may be interposed between the first row decoder 340 and the second row decoder 350.

Figure 9:
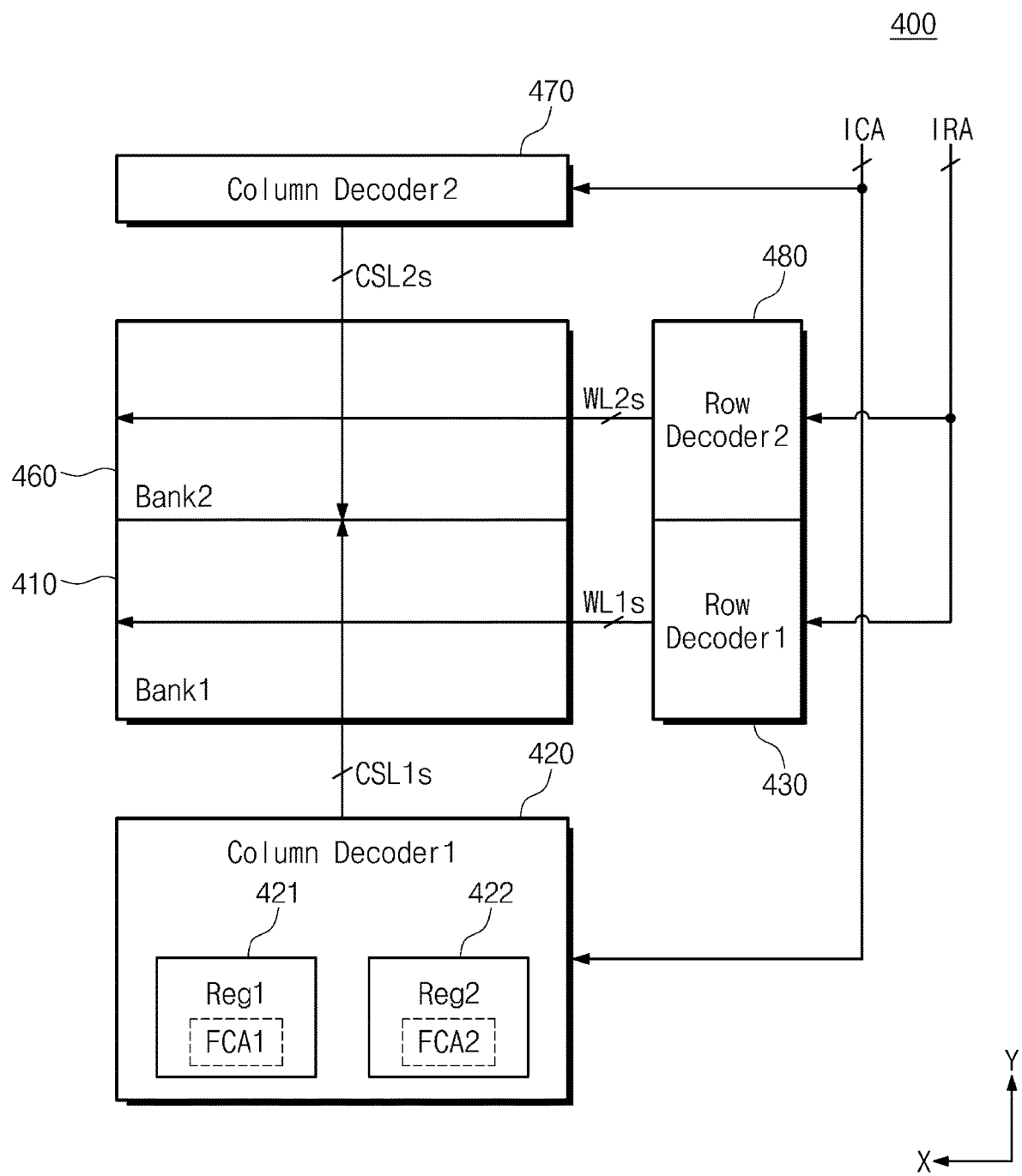
FIG. 9 is a block diagram illustrating a memory device according to another exemplary embodiment.

FIG. 9 is a block diagram illustrating a memory device according to another exemplary embodiment. A memory device 400 may include a first bank 410, a first column decoder 420, a first row decoder 430, a second bank 460, a second column decoder 470, and a second row decoder 480.

The first bank 410 may be a memory cell array described with reference to FIG. 1, and thus a repeated description will be omitted for conciseness. The second bank 460 may be a memory cell array which is independent of the first bank 410 and is described with reference to FIG. 1, and thus a repeated description will be omitted for conciseness. As illustrated in FIG. 9, address transfer paths for accessing the first bank 410 and the second bank 460 may be shared or may not be shared. Addresses which are transmitted to access memory cells of the first bank 410 and the second bank 460 are independent of each other.

Operations of the first row decoder 430 and the second row decoder 480 may be similar to the operations of the first row decoder 140 and the second row decoder 240, respectively, described above, and thus repeated descriptions are omitted for conciseness. An operation of the first column decoder 420 may be similar to the operation of the first column decoder 120 described above, and thus a repeated description is omitted for conciseness. An operation of the second column decoder 470 may be similar to the operation of the second column decoder 130 described above, and thus a repeated description is omitted for conciseness. Like global input/output lines described with reference to FIGS. 2 to 5, input/output lines which are controlled by the first column decoder 420 may be arranged in the first bank 410. Like global input/output lines described with reference to FIGS. 2 to 5, input/output lines which are controlled by the second column decoder 470 may be arranged in the second bank 460. The input/output lines of the first bank 410 and the input/output lines of the second bank 460 are independent of each other.

The first column decoder 420 may select memory cells of the first bank 410 by transmitting first column selection signals in the Y-axis direction through the first column selection lines CSL1s and may perform data input/output on the selected memory cells through the input/output lines of the first bank 410. The second column decoder 470 may select memory cells of the second bank 460 by transmitting second column selection signals in an opposite direction to the Y-axis direction through the second column selection lines CSL2s and may perform data input/output on the selected memory cells through the input/output lines of the second bank 460. The first column decoder 420 and the second column decoder 470 may be opposite to each other with respect to the first bank 410 and the second bank 460 or may face each other with respect to the first bank 410 and the second bank 460. The first bank 410 and the second bank 460 may be interposed between the first column decoders 420 and the second column decoder 470.

In an exemplary embodiment, the first column decoder 420 may include a first register 421 for repairing the first column selection lines CSL1s. The first column decoder 420 may include a second register 422 for repairing the second column selection lines CSL2s. An operation of the first column decoder 420 may be similar to the operation of the first column decoder 120 when the first region 111 of FIG. 2 corresponds to the first bank 410, and thus a repeated description is omitted for conciseness. An operation of the second column decoder 470 may be similar to the operation of the second column decoder 130 when the second region 112 of FIG. 2 corresponds to the second bank 460, and thus a repeated description is omitted for conciseness. Since write circuits to write the first fail column address FCA1 and the second fail column address FCA2 are shared or merged and since a compare circuit to compare the input column address ICA with the first fail column address FCA1 and a compare circuit to compare the input column address ICA with the second fail column address FCA2 are shared and merged, the area of the memory device 400 may decrease.

Figure 10:
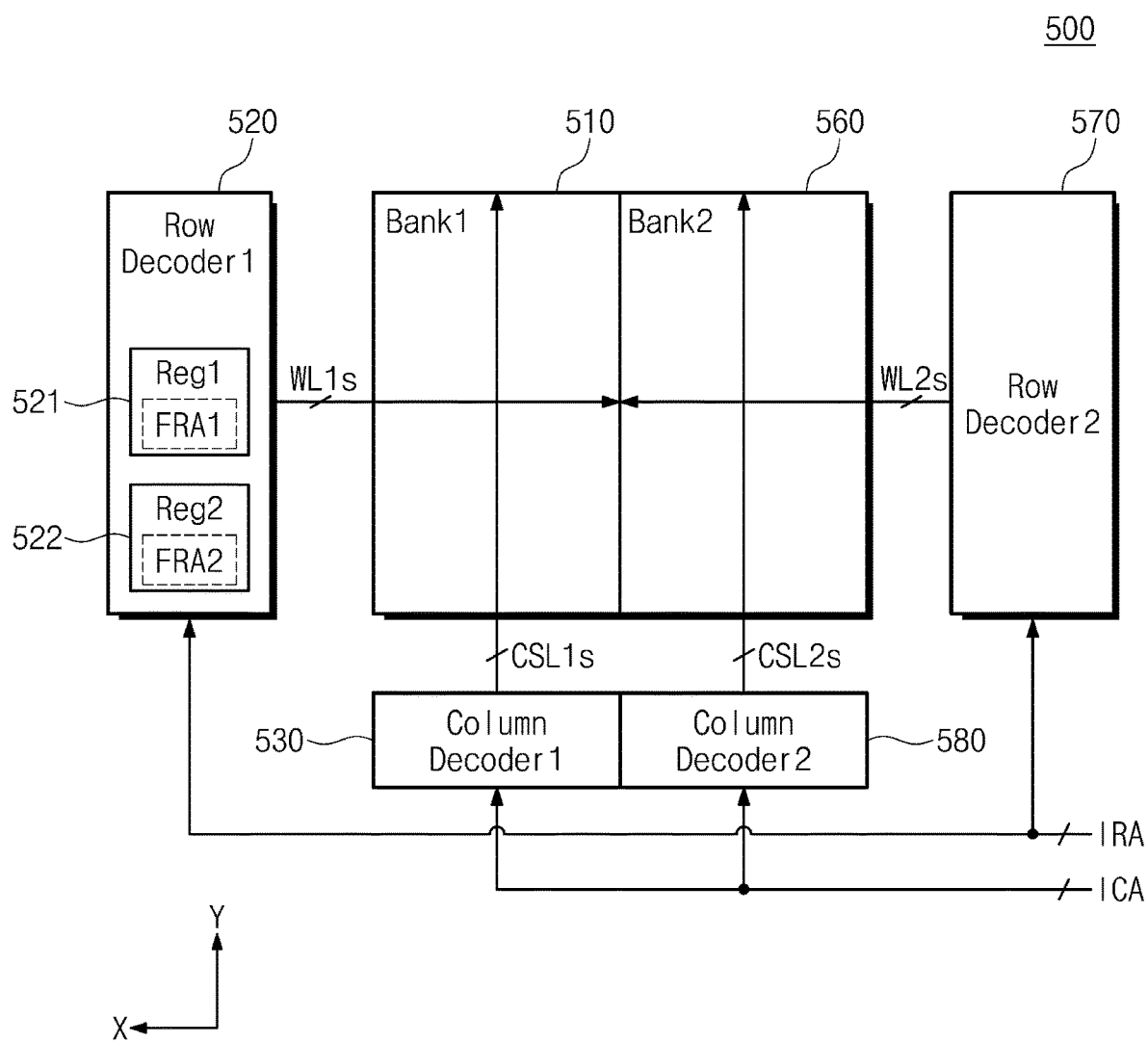
FIG. 10 is a block diagram illustrating a memory device according to another exemplary embodiment.

FIG. 10 is a block diagram illustrating a memory device according to another exemplary embodiment. A memory device 500 may include a first bank 510, a first row decoder 520, a first column decoder 530, a second bank 560, a second row decoder 570, and a second column decoder 580. The first bank 510 and the second bank 560 may be substantially identical to the first bank 410 and the second bank 460 of FIG. 9, and thus a repeated description is omitted for conciseness. Each of the first column decoder 530 and the second column decoder 580 may be substantially identically to the column decoder 240 of FIG. 7, and thus a repeated description is omitted for conciseness. A difference between the memory device 500 and the memory device 400 will be described.

The first row decoder 520 and the second row decoder 570 may be opposite to each other with respect to the first bank 510 and the second bank 560 or may face each other with respect to the first bank 510 and the second bank 560. The first bank 510 and the second bank 560 may be interposed between the first row decoder 520 and the second row decoder 570. The first row decoder 520 may include a first register 521 for repairing the first word lines WL1s. The first row decoder 520 may include a second register 522 for repairing the second word lines WL2s. An operation of the first row decoder 520 may be similar to the operation of the first row decoder 220 when the first region 211 of FIG. 6 corresponds to the first bank 510, and thus a repeated description is omitted for conciseness. An operation of the second row decoder 570 may be similar to the operation of the second row decoder 230 when the second region 212 of FIG. 6 corresponds to the second bank 560, and thus a repeated description is omitted for conciseness. Since write circuits to write the first fail row address FRA1 and the second fail row address FRA2 are shared or merged and since a compare circuit to compare the input row address IRA with the first fail row address FRA1 and a compare circuit to compare the input row address IRA with the second fail row address FRA2 are shared and merged, the area of the memory device 500 may decrease.

The memory devices 100, 200, 300, 400, and 500 according to various exemplary embodiments may merge locations of registers storing fail addresses. Accordingly, the area of the memory devices 100, 200, 300, 400, and 500 may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory device comprising:
a bank including first memory cells connected to a first column selection line and second memory cells connected to a second column selection line;
a first column decoder configured to select the first memory cells by transmitting a first column selection signal in a first direction through the first column selection line; and
a second column decoder configured to select the second memory cells by transmitting a second column selection signal in a second direction opposite to the first direction through the second column selection line,
wherein the first column decoder includes:
a first register configured to store a first fail column address of the first memory cells; and
a second register configured to store a second fail column address of the second memory cells.

2. The memory device of claim 1, wherein the first column decoder further includes:
a compare circuit configured to compare an input column address with one of the first fail column address and the second fail column address.

3. The memory device of claim 2, wherein the first column decoder is configured to:
generate a first hit signal based on a result of comparing the input column address with the first fail column address; and
select first redundancy memory cells by using the first hit signal instead of memory cells corresponding to the first fail column address among the first memory cells.

4. The memory device of claim 2, wherein the first column decoder is configured to:
generate a second hit signal based on a result of comparing the input column address with the second fail column address; and
transmit the second hit signal to the second column decoder, and
wherein the second column decoder is configured to:
select second redundancy memory cells by using the second hit signal instead of memory cells corresponding to the second fail column address among the second memory cells.

5. The memory device of claim 2, further comprising:
a command decoder configured to transmit the input column address to the first column decoder and the second column decoder,
wherein the command decoder is positioned more adjacent to the first column decoder than the second column decoder.

6. The memory device of claim 1, further comprising:
an anti-fuse array in which the first fail column address and the second fail column address are programmed,
wherein the first column decoder further includes:
a write circuit configured to write the first fail column address transmitted from the anti-fuse array to the first register and to write the second fail column address transmitted from the anti-fuse array to the second register.

7. The memory device of claim 1, wherein the bank further includes:
third memory cells connected to a first word line and selected by the first column decoder; and
fourth memory cells connected to the first word line and selected by the second column decoder,
wherein the first column decoder further includes:
a third register configured to store a third fail column address of the third memory cells and the fourth memory cells; and
a compare circuit configured to compare an input column address with the third fail column address,
wherein the first column decoder is configured to:
generate a third hit signal based on a result of comparing the input column address with the third fail column address;
transmit the third hit signal to the second column decoder; and
select third redundancy memory cells by using the third hit signal instead of memory cells corresponding to the third fail column address among the third memory cells, and
wherein the second column decoder is configured to:
select fourth redundancy memory cells by using the third hit signal transmitted from the first column decoder instead of memory cells corresponding to the third fail column address among the fourth memory cells.

8. The memory device of claim 1, wherein the bank further includes:
fifth memory cells connected to a second word line and selected by the first column decoder; and
sixth memory cells connected to a third word line, which is selected at the same time with the second word line, and selected by the second column decoder,
wherein the first column decoder further includes:
a fourth register configured to store a fourth fail column address of the fifth memory cells and the sixth memory cells; and a compare circuit configured to compare an input column address with the fourth fail column address, wherein the first column decoder is configured to:

generate a fourth hit signal based on a result of comparing the input column address with the fourth fail column address;

transmit the fourth hit signal to the second column decoder; and select fifth redundancy memory cells by using the fourth hit signal instead of memory cells corresponding to the fourth fail column address among the fifth memory cells, and wherein the second column decoder is configured to:

select sixth redundancy memory cells by using the fourth hit signal transmitted from the first column decoder instead of memory cells corresponding to the fourth fail column address among the sixth memory cells.

9. The memory device of claim 1, wherein input/output lines of the first memory cells and the second memory cells are arranged in the bank, and wherein the first column decoder performs data input/output on the first memory cells and the second memory cells through the input/output lines.

\* \* \* \* \*